(12) United States Patent
Andreev et al.

(10) Patent No.: US 6,615,397 B1
(45) Date of Patent: Sep. 2, 2003

(54) OPTIMAL CLOCK TIMING SCHEDULE FOR AN INTEGRATED CIRCUIT

(75) Inventors: Alexander E. Andreev, San Jose, CA (US); Egor A. Andreev, San Jose, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 295 days.

(21) Appl. No.: 09/879,380

(22) Filed: Jun. 12, 2001

Related U.S. Application Data

(63) Continuation of application No. 09/756,561, filed on Jan. 8, 2001, now abandoned.

(51) Int. Cl.[7] .............................................. G06F 17/50
(52) U.S. Cl. ............................................................ 716/6
(58) Field of Search ................................ 716/1, 2, 4, 5, 716/6, 7; 703/16, 17, 19

(56) References Cited

U.S. PATENT DOCUMENTS

| | | | | |
|---|---|---|---|---|
| 5,555,188 A | * | 9/1996 | Chakradhar | 716/6 |
| 5,663,888 A | * | 9/1997 | Chakradhar | 716/6 |
| 5,761,487 A | * | 6/1998 | Yuguchi | 716/2 |
| 5,894,419 A | * | 4/1999 | Galambos et al. | 716/6 |
| 5,963,728 A | * | 10/1999 | Hathaway et al. | 716/3 |

* cited by examiner

*Primary Examiner*—Leigh M. Garbowski
(74) *Attorney, Agent, or Firm*—Westman, Champlin & Kelly

(57) ABSTRACT

A netlist graph of an IC cell contains cell pin vertices, auxiliary vertices, and edges between vertices having a length. A clock shift SH(V) is assigned to each auxiliary vertex so that for any two auxiliary vertices, a difference between the clock shift of the two auxiliary vertices is no greater than a design time of the two auxiliary vertices. The clock shift is assigned such that SH(V1)+DELAY(V1,V2)−SH(V2)≦f·BOUND(V1,V2), where SH(V1) and SH(V2) are the clock shift of first and second auxiliary vertices, DELAY(V1,V2) is a maximal delay of the path between the first and second auxiliary vertices, f is a minimize constant, and BOUND(V1,V2) is a timing restriction of the first and second auxiliary vertices.

16 Claims, 4 Drawing Sheets

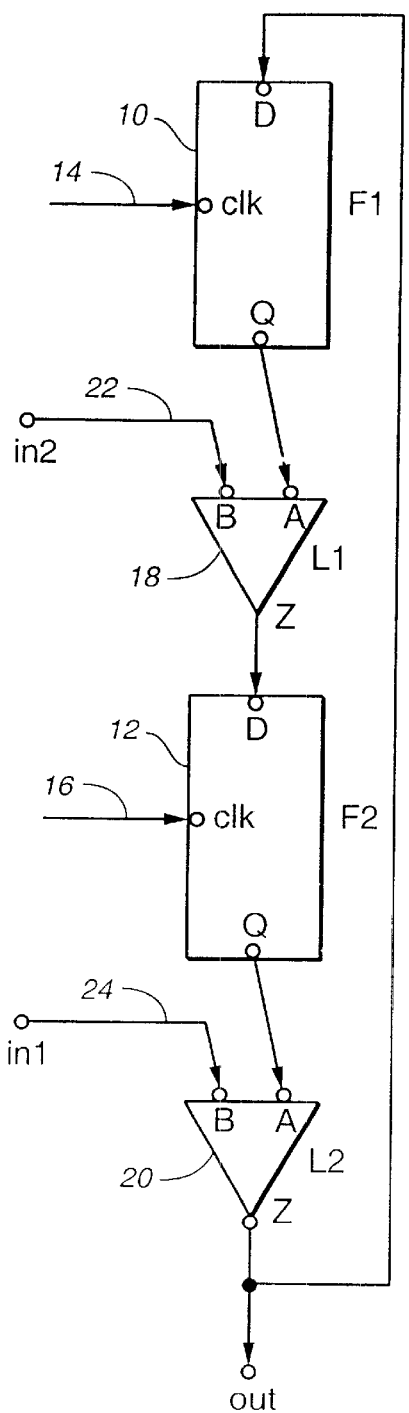
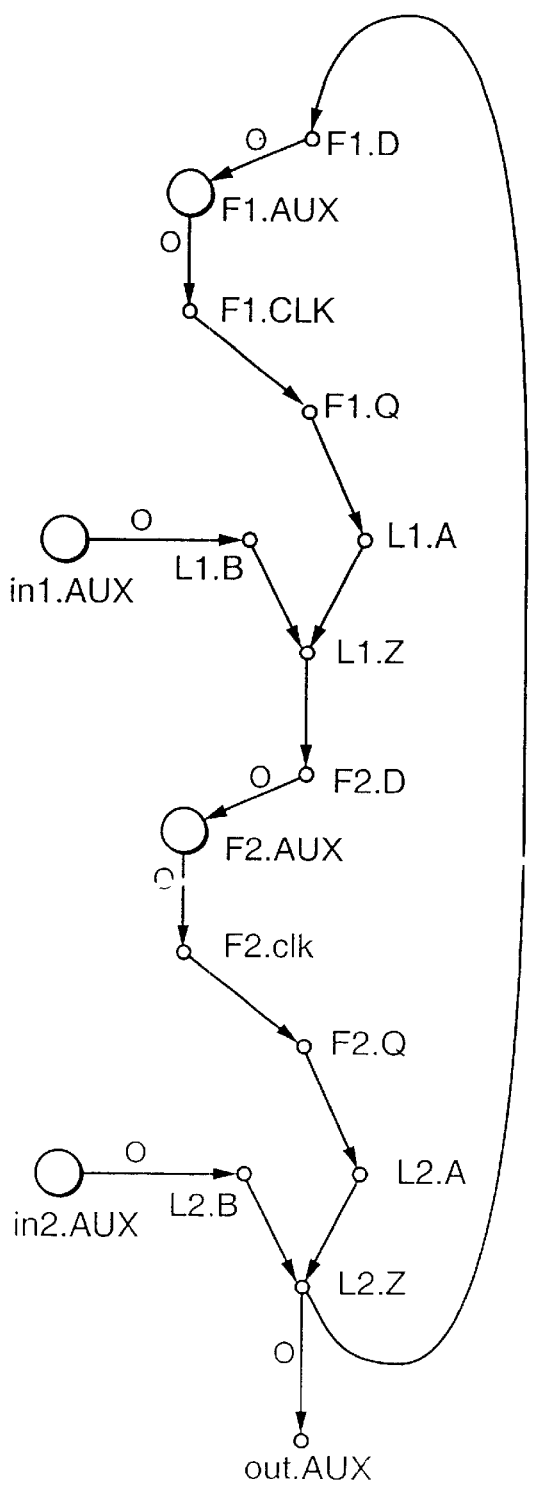
*FIG._1*                    *FIG._2*

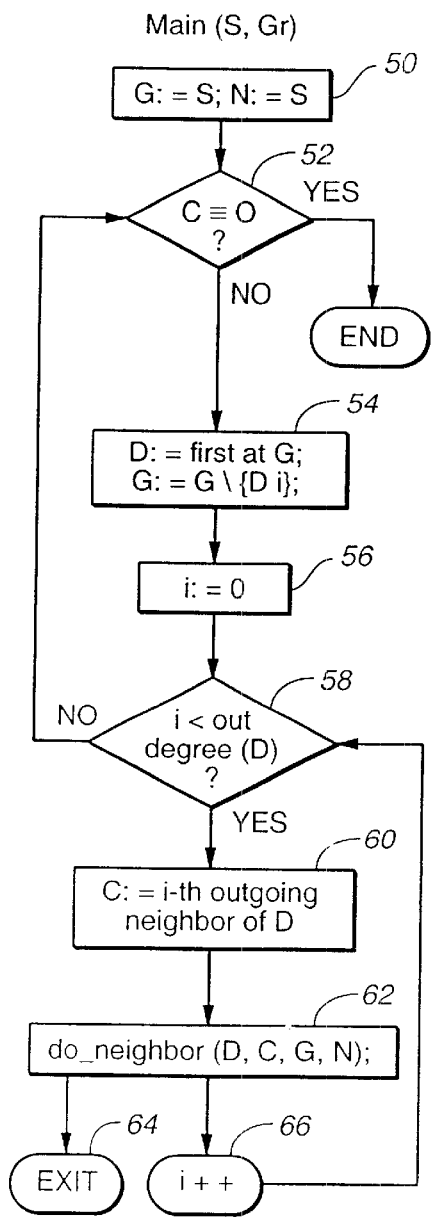
FIG._3
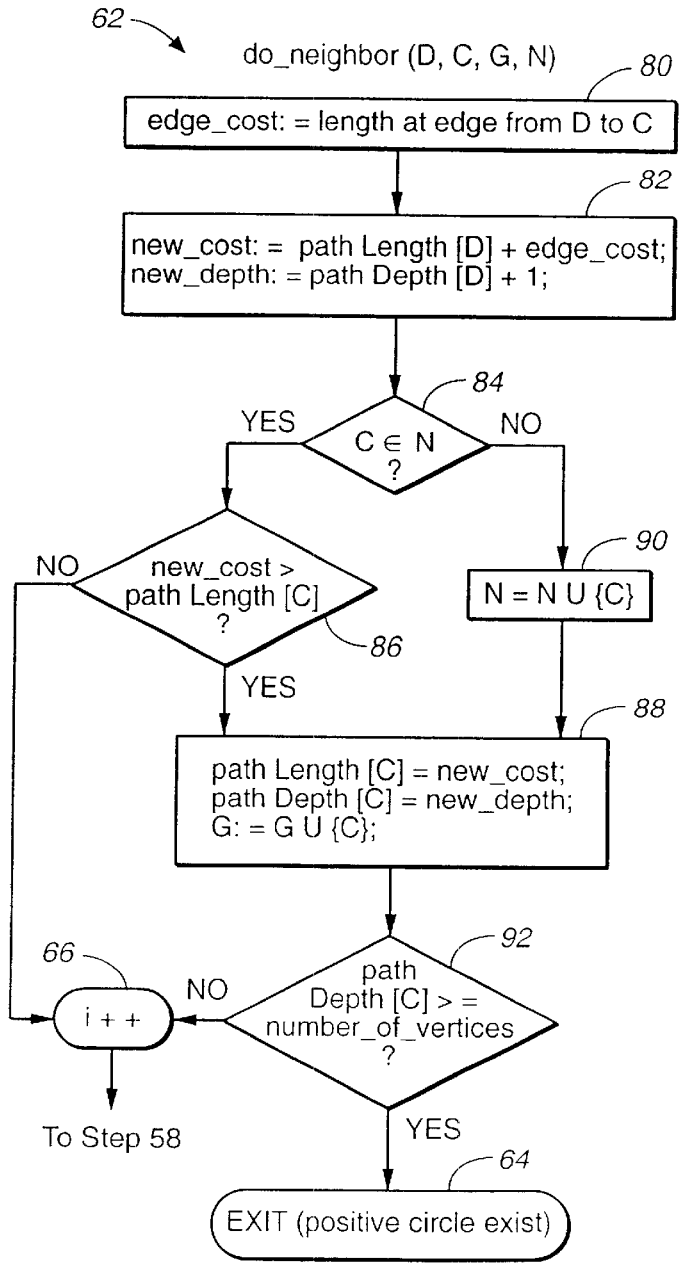
FIG._4

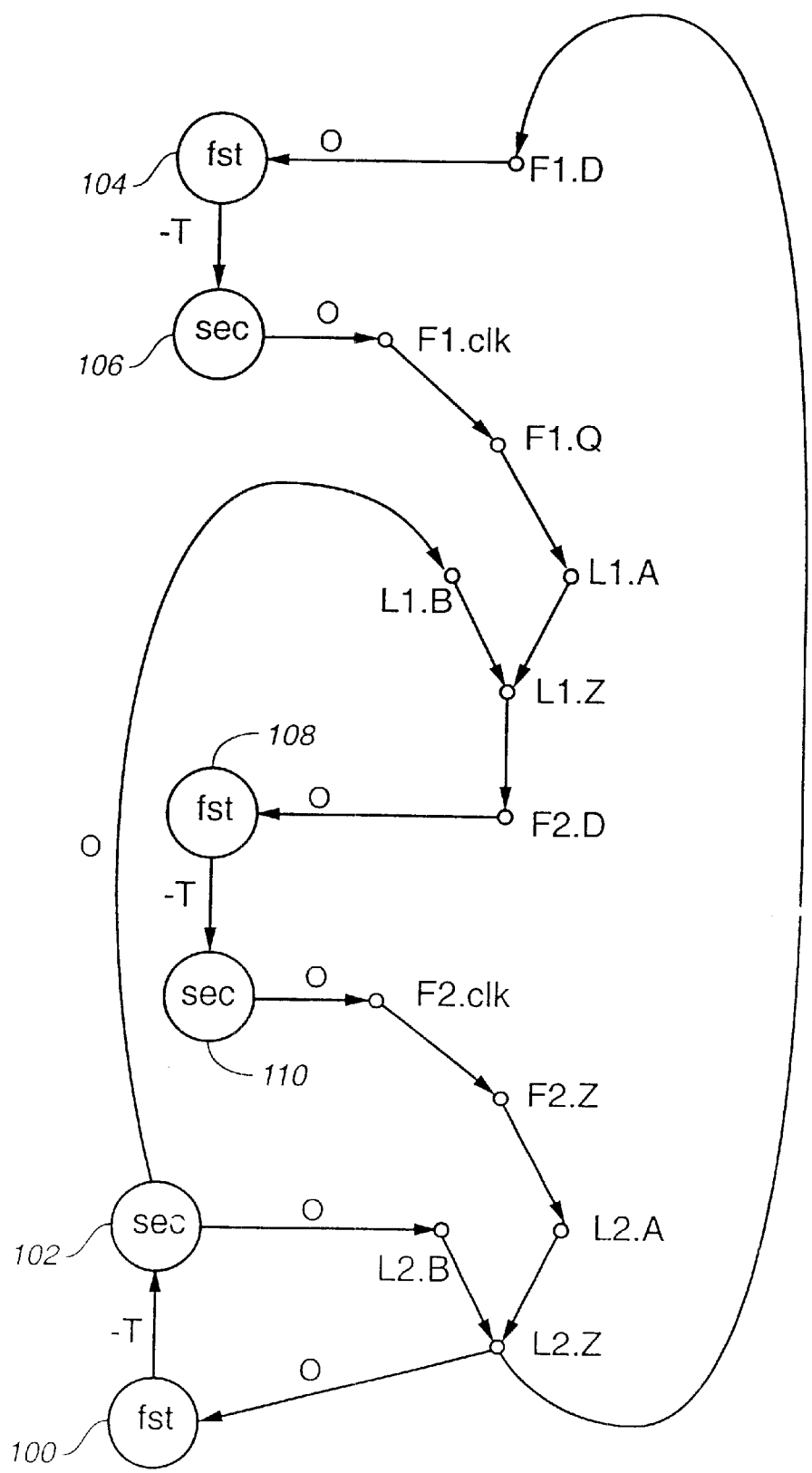
FIG._5

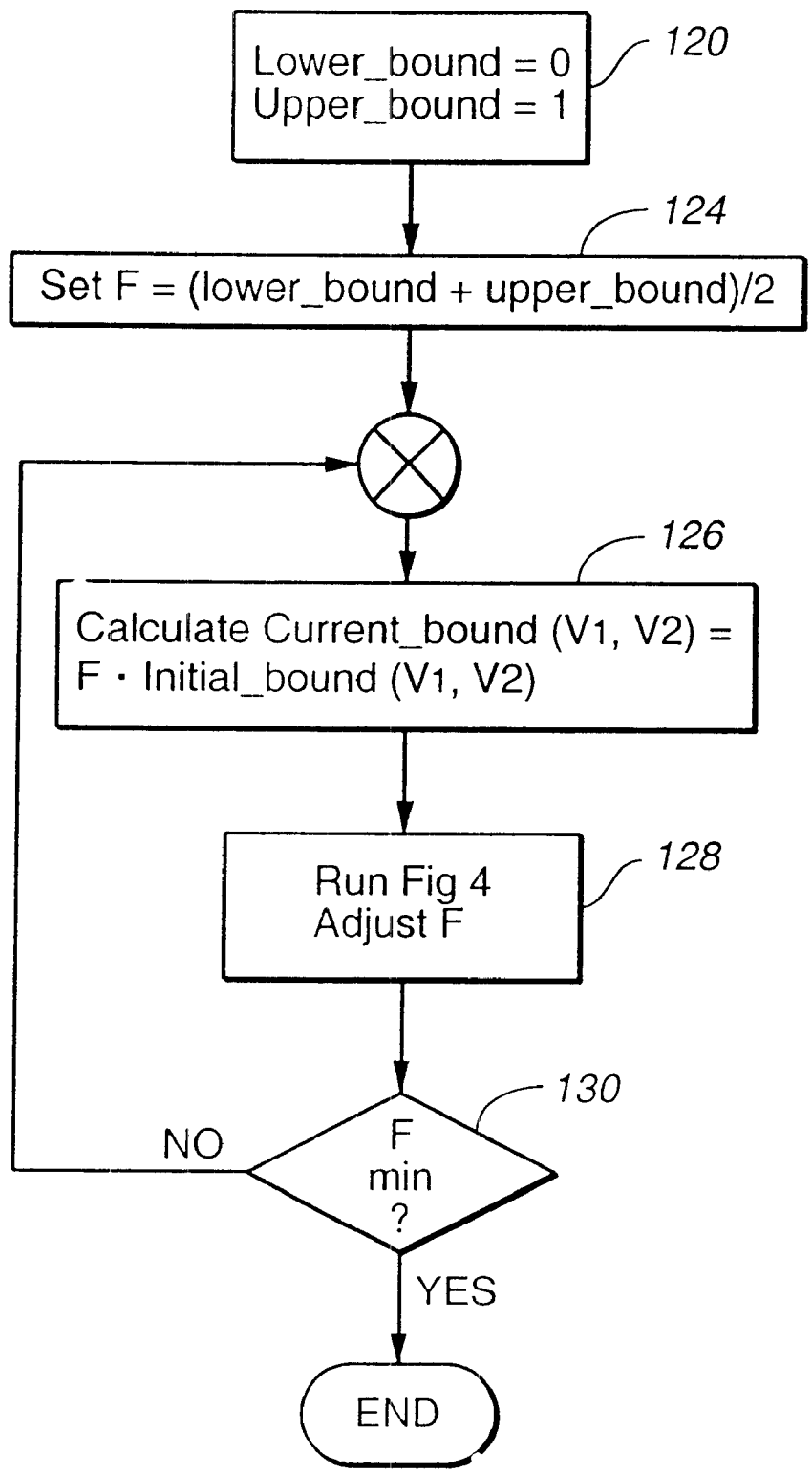
FIG._6

US 6,615,397 B1

OPTIMAL CLOCK TIMING SCHEDULE FOR AN INTEGRATED CIRCUIT

CROSS-REFERENCE TO RELATED APPLICATION

This application is a continuation of application Ser. No. 09/756,561 filed Jan. 8, 2001 now abandoned.

BACKGROUND OF THE INVENTION

This invention relates to optimal clock timing in an integrated circuit (IC) chip, and particularly to a technique for minimizing clock cycles based on chip design.

Most integrated circuits operate on the principle that the clock arrival time is the same for each flip-flop, so that the minimum clock cycle must be at least equal to the maximum delay for flip-flop pairs. More particularly, the clock cycle is set so that the clock signal arrives at the same time for every flip-flop pair in the chip. However, delays between flip-flop pairs may not be the same for all flip-flop pairs of an IC chip. Thus, some IC chips employ various configurations of flip-flop pairs having different delays, so the delay between members of one flip-flop pair may be different from the delay between member of a different flip-flop pair. Setting the clock cycle to accommodate all flip-flop pairs requires a minimal clock cycle that is at least equal to the maximum delay of the worst-case flip-flop pair. As a result, an unnecessary delay is introduced to the operation of those flip-flop pairs operating with smaller delays.

The present invention is directed to a clock timing schedule to employ the minimum clock cycle.

SUMMARY OF THE INVENTION

In its broadest concept, the present invention is directed to finding a minimal clock cycle for any given flip-flop pair of an IC chip, and adding to that cycle such delay as may be necessary for the clock shift for a destination flip-flop.

In one form of the invention, a netlist graph of the cell is provided containing cell pin vertices, auxiliary vertices, and edges between vertices having a length. A clock shift SH(V) is assigned to each auxiliary vertex so that for any two auxiliary vertices, a difference between the clock shift of the two auxiliary vertices is no greater than a design time of the two auxiliary vertices.

In preferred versions of the invention, the clock shift is assigned to each auxiliary vertex such that $SH(V1)+DELAY(V1,V2)-SH(V2) \leq f \cdot BOUND(V1,V2)$, where SH(V1) is the clock shift of a first auxiliary vertex, SH(V2) is the clock shift of a second auxiliary vertex, DELAY(V1,V2) is a maximal delay of the path between the first and second auxiliary vertices, f is a constant, and BOUND(V1,V2) is a timing restriction of the first and second auxiliary vertices. In some forms of the invention, the constant f is calculated by setting f equal to an average or a lower_bound and an upper_bound. The cycle is then found during successive iterations of the process using different values of f until a minimum value of f is found.

The clock shift is assigned to a vertex by finding a cost of the length of the edges of the vertices from an input vertex to an output vertex. A cycle to the edges is found such that a delay may be added to selected edges without affecting clock stability of the graph. More particularly, the auxiliary vertices that define an input or an output to the netlist graph are merged. All auxiliary vertices are then split into input and output auxiliary vertices such that the input vertex has all inputs of the auxiliary vertices and the output vertex has all outputs of the auxiliary verties. An edge having a length of –T is inserted between respective input and output vertices, where T is the length of the clock cycle.

In another form of the invention, the process is carried out by a computer operated by computer code on a computer medium.

BRIEF DESCRIPTION OF THE DRAWINGS

FIG. 1 is a circuit diagram of a cell whose clock timing is to be optimized.

FIG. 2 is a tree illustrating the netlist graphs of the initial clock timing of the cell of FIG. 1.

FIG. 3 is a flowchart of the process of optimizing the cell clock timing according to the present invention.

FIG. 4 is a flowchart of a subroutine of the process illustrated in FIG. 3.

FIG. 5 is a tree illustrating the optimized clock timing of the cell of FIG. 1.

FIG. 6 is a flowchart of another subroutine of the process of FIG. 3.

DETAILED DESCRIPTION OF THE PREFERRED EMBODIMENTS

The present invention is directed to a process for optimizing clock scheduling in a cell of an integrated circuit. In preferred embodiments of the invention, the process is carried out by a computer, and the invention is provided in the form of a computer code on a computer medium to cause the computer to carry out the process.

FIG. 1 illustrates the circuit diagram of a flip-flop pair consisting of gates 10 and 12 each having a D input and a Q output, and each clocked by a clock input 14, 16. Logic gate 18 has an A input coupled to the Q output of gate 10 and logic gate 20 has its A input coupled to the Q output of gate 12. The B input of gate 18 receives an input at 22 and the B input of gate 20 receives an input at 24. The Z output of gate 18 is coupled to the D input of gate 12, and the Z output of gate 20 is coupled to the D input of gate 10. The Z output of one of gates 18 and 20, such as gate 20, provides an output for the flip-flop pair.

FIG. 2 illustrates a netlist graph of the flip-flop illustrated in FIG. 1. The graph of FIG. 2 contains two types of vertices, cell pin vertices and auxiliary vertices. The cell pin vertices are identified at F1.D, F1.clk and F1.Q for gate 10, L1.A, L1.B and L1.Z for gate 18, F2.D, F2.clk and F2.Q for gate 12, and L2.A, L2.B and L2.Z for gate 20. The auxiliary vertices are identified as F1.aux, F2.aux, in1.aux, in2.aux and out.aux. Each cell or gate of the graph includes edges between the vertices from the input to the output pins of the cell or gate. The length of these edges is the cell or gate delay between these pins. Thus, the edges between F1.D to F1.Q represent the cell delay of gate 10. The length of the edges from the driver pins or output pin of a prior cell or gate to the input cell pin of the next gate is the interconnect delay between gates or cells. Thus, the edge between vertex F1.Q and L1.A represents the interconnect delay between gates 10 and 18. The auxiliary vertices have a zero length edge from the cell pin to the vertices, and from the vertices to the next cell pin or output. The present invention assigns a clock shift SH(V) to each auxiliary vertex such that $$SH(V1)+DELAY(V1,V2)-SH(V2) \leq k \cdot BOUND(V1,V2),$$

where DELAY(V1,V2) is the maximum delay of the paths of vertex V1 to vertex V2, k is a constant, and BOUND (V1,V2) is the timing restriction for the auxiliary vertices.

In its broadest form, the present invention optimizes distribution of the clock arrival time to the flip-flops. As used herein, the term "clock arrival times" means the time that the clocking edge of a clock signal arrives at the specific pin of the flip-flop. In the present invention, the clock arrival time is set to zero and the arrival time of data to the flip-flops is calculated. The clock arrival time for the next clock signal is identified and the difference between that time and the data arrival time is subtracted from the clock cycle for that pin. The procedure is iterated through all vertices of the graph until the clock cycles are optimized.

The process commences with a graph, such as the graph illustrated in FIG. 2, and is carried out using the procedures of the flow chart of FIG. 3. The length of each edge of the graph of FIG. 2 may be positive, zero or negative, but the graph itself must not be positively oriented (i.e., the graph must be negatively oriented or zero oriented). A negatively oriented graph means that the clock arrival time of a signal at a vertex C will be later in time than the clock arrival time at an upstream vertex D. A positively oriented graph means that the clock arrival time for the downstream vertex, C, leads the clock arrival time, and the data, from the upstream vertex, D, which is an unstable condition. Only graphs with negative or zero orientation will permit the addition of delays to selected graph edges to find a stability point for the circuit.

The process employs two mathematical sets defining neighborhood vertices N and border vertices G. These mathematical sets operate on a first-in, first-out basis. The process employs two arrays, each having a capacity equal to the number of vertices in the graph Gr. One of the arrays, called a pathLength array, contains the number of steps used to reach a given vertex by a given path. The second array, called a pathDepth array, contains the cost of the path to the vertex. Hence, pathLength[V] indicates the number of steps of the path for vertex V, and pathDepth[V] identifies the cost of the steps of that path.

The process begins at step 50 (FIG. 3) by initializing all of the elements of the pathLength and pathDepth arrays to zero. The vertices of the start subset S of the graph Gr are inserted into the neighborhood N and border G mathematical sets. A test is conducted at step 52 to make certain that the mathematical set G is not empty. If the mathematical set G is empty, the process ends with a failure. Assuming the mathematical set G is not empty, the next or first vertex of G is obtained, where G comprises a plurality of vertices Di. At step 56, i is set to zero so that the first vertex $D_0$ is considered. At step 58, a test is determined to make certain that $D_0$ is not the end vertex of the graph. Thus, at step 58, the test is made that i is smaller than the number i of the outermost vertex $D_i$. Since the maximum or outdegree vertex of the graph is a vertex having a number I greater than 0, the process continues to step 60. (If i equals zero, the mathematical set for the border G would be zero, so the process would loop back to step 52 to end the process.

Having determined that the vertex $V_0$ is not the last vertex of the graph, the process continues to step 60 to identify a vertex C which is the i-th, outgoing neighbor of D. Thus, C will be a vertex, outgoing from D. Since in this first iteration i=0, the vertex selected is $C_0$, which is the next vertex. At step 62, additional processing is performed, as described in connection with FIG. 4, to lead to either a successful exit at 64 or to an incrementing i at 66 and return to step 58 to perform the process between vertex $D_0$ and vertex $C_1$ for the next iteration. Performing a return through step 66 increments vertex number i by 1, toward the output vertex, and re-performs the process of FIG. 4.

Referring to FIG. 4, the edge_cost is calculated at step 80 as the length of an edge from vertex D to vertex $C_i$. The edge_cost increases with successive iterations as the length from D to more distal vertices $C_i$ are measured. At step 82, new_cost is calculated as equal to the pathLength to vertex D plus the edge_cost calculated at step 80, new_cost= pathLength[D]+edge_cost. If vertex D is the first vertex in the graph, pathLength[D] might be equal to zero. However, if vertex D is some more centrally positioned vertex, pathLength[D] will be the path length from the beginning of the graph to vertex D. A new-depth is also calculated as equal to the pathDepth to vertex D (which may be zero if D is the initial vertex of the graph), plus 1.

At step 84, the determination is made as to whether vertex C is a member of the neighborhood mathematical set. If it is, the process continues to step 86 where a determination is made as to whether the new_cost is greater than the pathLength to vertex $C_i$. If the new_cost is greater than pathLength[$C_i$], calculations are performed at step 88 setting the pathLength[C] as equal to the new_cost, and pathDepth [C] as equal to the new_depth. Mathematical set for the border G is then adjusted to include vertex C, G:=G∪[C].

If, at step 84, it was determined that vertex C was not a member of the neighborhood N, the process would extend to step 90 where C is added to the neighborhood, N:=N∪[C], and the process advances to step 88. If, at step 92, the pathDepth[C] is greater than or equal to the number of vertices in the graph, then the process exits at step 66 indicating a positive cycle to the timing. If the pathDepth[C] is smaller than the number of vertices, the process loops back through step 64 by incrementing i to the next vertex $C_i$, looping back to step 58 (FIG. 3).

Additionally, if at step 86, the new_cost was smaller than or equal to the pathLength[C], the process illustrated in FIG. 4 loops to step 64 to increment i and return to step 58 (FIG. 3).

If a successful exit occurs at step 66, the auxiliary vertices illustrated in FIG. 2 are merged so that the inputs and outputs have a zero shift. Then the auxiliary vertices are split into fst(V) and sec(V) vertices. Vertices fst(V) inherits all the incoming edges to the auxiliary vertex, and vertices sec(V) inherits all outgoing edges. In addition, a new edge with a length –T is inserted between each fst(V) and sec(V) vertex, where T is equal to the clock cycle.

Comparing FIG. 5 to FIG. 2, in1.aux, in2.aux and out.aux auxiliary vertices are merged into a single auxiliary vertex and split into fst vertex 100 and sec vertex 102, with a pathLength of –T between them. Similarly, since F1.aux and F2.aux have both input and output, they are each split, such that F1.aux is split into fst vertex 104 and sec vertex 106 while F2.aux vertex is split into fst vertex 108 and sec vertex 110. Similarly, an edge having a length –T is between the respective fst and sec vertices.

In the event of arbitrary clock restrictions on the graph, a new graph is constructed containing only auxiliary vertices. If the original graph included a path from a vertex V1 to vertex V2, the length of the edge from vertex V1 to vertex V2 is set to the maximal pathLength. Then, for each of the auxiliary vertices, the starting set S contains only the current auxiliary vertex. The process described in connection with FIG. 4 is run for auxiliary vertices that are in the neighbor set N. If an auxiliary vertex is found in the N set, an edge is added from the current auxiliary vertex to the newly found auxiliary vertex with a cost equal to pathLength of the found auxiliary vertex minus the bound between the two vertices, BOUND(V1,V2). With all the vertices in the new graph in the starter set, the procedure is rerun to make certain the results agree with the requirement that BOUND(V1,V2) is greater than or equal to the shift of vertex V1 plus the delay between vertices V1 and V2, minus the clock shift of vertex V2:

$$BOUND(V1,V2) \geq SH(V1)+DELAY(V1,V2)-SH(V2).$$

Assuming no error messages or failures occur in the checking of the solution, the process continues at FIG. 6 by selecting a lower bound of zero and upper bound of 1 at step 120 and setting a value f equal to the average of the upper and lower bounds at step 122. An initial BOUND(V1,V2) is set to the BOUND(V1,V2) previously found, and a current BOUND(V1,V2) is set equal to f times the initial BOUND (V1,V2) at step 124. The process of FIG. 4 is then repeated using the current BOUND(V1,V2). Then the lower bound is raised to f and the process rerun. If no positive cycle is found, the upper bound is lowered to f and the process rerun based on f times the initial BOUND(V1,V2). The process is repeated at step 126 through several iterations until a minimum value of f is found at step 130 which can be multiplied by all of the restrictions of BOUND(V1,V2) and still result in a solution to the optimization.

The present invention thus provides a technique of optimizing scheduling of clock signals to a cell of an integrated circuit. In preferred forms of the invention, the process is carried out by a computer, and a computer medium is provided containing computer code to cause the computer to carry out the process.

Although the present invention has been described with reference to preferred embodiments, workers skilled in the art will recognize that changes may be made in form and detail without departing from the spirit and scope of the invention.

What is claimed is:

1. A process for optimizing clock scheduling to a cell of an integrated circuit, comprising steps of:
   a) providing a netlist graph of the cell containing cell pin vertices and auxiliary vertices, and edges between vertices having a length; and
   b) assigning a clock shift SH(V) to each auxiliary vertex so that for any two auxiliary vertices, a difference between the clock shift of the two auxiliary vertices is no greater than a design time of the two auxiliary vertices.

2. The process of claim 1 wherein step (b) is performed by assigning a clock shift, SH(V), to each auxiliary vertex such that $$SH(V1)+DELAY(V1,V2)-SH(V2) \leq f \cdot BOUND(V1,V2),$$

where SH(V1) is the clock shift of a first auxiliary vertex, SH(V2) is the clock shift of a second auxiliary vertex, DELAY(V1,V2) is a maximal delay of the path between the first and second auxiliary vertices, f is a constant, and BOUND(V1,V2) is a timing restriction of the first and second auxiliary vertices.

3. The process of claim 2, including:
   c) finding a cost of the length of the edges of the vertices from an input vertex to an output vertex, and
   d) identifying a cycle to the edges such that a delay may be added to selected edges without affecting clock stability of the graph.

4. The process of claim 3, wherein step (b) is performed by:
   b1) merging all auxiliary vertices defining an input or an output to the netlist graph,
   b2) splitting each merged and remaining auxiliary vertex into input and output auxiliary vertices such that the input vertex has all inputs of the respective merged or remaining auxiliary vertex and the output vertex has all outputs of the respective merged or remaining auxiliary vertex, and
   b3) inserting an edge between respective input and output vertices having a length equal to −T, where T is the length of the clock cycle.

5. The process of claim 4, wherein step (b) includes:
   b4) defining a minimum value to the constant f.

6. The process of claim 5, wherein step (b4) is performed by:
   i) setting f=(lower_bound+upper_bound)/2, where lower_bound is initially 0 and upper_bound is initially 1, and
   ii) iteratively performing steps (c) and (d) with different values of f, wherein 0<f<1, until a minimum value of f is found satisfying step (d).

7. The process of claim 6 wherein one of the lower_bound and upper_bound is changed during successive iterations, with $0 \leq \text{lower\_bound} \leq 1$ and $0 \leq \text{upper\_bound} \leq 1$.

8. The process of claim 1 wherein the netlist graph comprises:
   i) a description of each cell delay between input cell pin vertex and an output cell pin vertex for those input and output cell pins that are coupled together,
   ii) a description of each interconnect delay between a driver pin vertex and an input pin vertex,
   iii) a description of a first clock shift between a data input pin vertex and a first auxiliary vertex and between the first auxiliary vertex and a clock input pin vertex,
   iv) a description of a second clock shift between each design input pin vertex and a second auxiliary vertex, and
   v) a description of a third clock shift between a third auxiliary vertex and a design output pin vertex.

9. A computer useable medium having a computer readable program embodied therein for addressing data to optimize clock scheduling to a cell of an integrated circuit, the computer readable program comprising:
   computer readable program code for causing the computer to define a netlist graph of the cell containing cell pin vertices and auxiliary vertices, and edges between vertices having a length; and
   computer readable program code for causing the computer to assign a clock shift SH(V) to each auxiliary vertex so that for any two auxiliary vertices, a difference between the clock shift of the two auxiliary vertices is no greater than a design time of the two auxiliary vertices.

10. The computer useable medium of claim 9 wherein the computer readable program code causes the computer to assign a clock shift, SH(V), to each auxiliary vertex such that $$SH(V1)+DELAY(V1,V2)-SH(V2) \leq f \cdot BOUND(V1,V2),$$

where SH(V1) is the clock shift of a first auxiliary vertex, SH(V2) is the clock shift of a second auxiliary vertex, DELAY(V1,V2) is a maximal delay of the path between the first and second auxiliary vertices, f is a constant, and BOUND(V1,V2) is a timing restriction of the first and second auxiliary vertices.

11. The computer useable medium of claim 10 wherein computer readable program further includes:

computer readable program code for causing the computer to calculate a cost of the length of the edges of the vertices from an input vertex to an output vertex, and computer readable program code for causing the computer to calculate a cycle to the edges such that a delay may be added to selected edges without affecting clock stability of the graph.

12. The computer useable medium of claim 11 wherein the computer readable program code that causes the computer to assign a clock shift further includes:

computer readable program code for causing the computer to merge all auxiliary vertices defining an input or an output to the netlist graph, computer readable program code for causing the computer to split each merged and remaining auxiliary vertex into input and output auxiliary vertices such that the input vertex has all inputs of the respective merged or remaining auxiliary vertex and the output vertex has all outputs of the respective merged or remaining auxiliary vertex, and computer readable program code for causing the computer to insert an edge between respective input and output vertices having a length equal to −T, where T is the length of the clock cycle.

13. The computer useable medium of claim 12 wherein the computer readable program code that causes the computer to assign a clock shift further includes:

computer readable program code for causing the computer to calculate a minimum value of the constant f.

14. The computer useable medium of claim 13, wherein the computer readable program code that causes the computer to calculate a minimum value of f includes:

computer readable program code for causing the computer to set f=(lower_bound+upper_bound)/2, where lower_bound is initially 0 and upper_bound is initially 1, and computer readable program code for causing the computer to iteratively assign clock shifts using different values of f, wherein 0<f<1, until a minimum value of f is found satisfying step (d).

15. The computer useable medium of claim 14, wherein the computer readable program code that causes the computer to set a value of f changed one of the lower_bound and upper_bound is during successive iterations, with $0 \leq$ lower_bound $\leq 1$ and $0 \leq$ upper_bound $< 1$.

16. The computer useable medium of claim 9, wherein the computer readable program code that causes the computer to define a netlist graph of the cell includes:

computer readable program code for causing the computer to define a description of each cell delay between input cell pin vertex and an output cell pin vertex for those input and output cell pins that are coupled together, computer readable program code for causing the computer to define a description of each interconnect delay between a driver pin vertex and an input pin vertex, computer readable program code for causing the computer to a define description of a first clock shift between a data input pin vertex and a first auxiliary vertex and between the first auxiliary vertex and a clock input pin vertex, computer readable program code for causing the computer to define a description of a second clock shift between each design input pin vertex and a second auxiliary vertex, and computer readable program code for causing the computer to define a description of a third clock shift between a third auxiliary vertex and a design output pin vertex.

* * * * *